United States Patent [19]
Englehardt

[11] Patent Number: 4,778,947
[45] Date of Patent: Oct. 18, 1988

[54] CABLE TERMINAL ASSEMBLY

[75] Inventor: Gary A. Englehardt, Manchester, N.H.

[73] Assignee: Wang Laboratories, Inc., Lowell, Mass.

[21] Appl. No.: 97,780

[22] Filed: Sep. 16, 1987

[51] Int. Cl.$^4$ .............................................. H05K 9/00
[52] U.S. Cl. ..................................... 174/35 R; 174/78
[58] Field of Search .................. 174/35 R, 65 SS, 78, 174/89; 439/92, 98, 99

[56] References Cited

U.S. PATENT DOCUMENTS

| | | | |
|---|---|---|---|
| 4,352,950 | 10/1982 | Meier | 174/65 SS X |
| 4,547,623 | 10/1985 | Van Brunt et al. | 174/35 R |
| 4,625,072 | 11/1986 | Van Brunt | 174/35 R |
| 4,705,915 | 11/1987 | Van Brunt et al. | 174/65 SS X |

Primary Examiner—Arthur T. Grimley
Assistant Examiner—David A. Tone
Attorney, Agent, or Firm—Michael H. Shanahan; Kenneth L. Milik

[57] ABSTRACT

A terminal assembly for interconnecting cable forms a wrinkle in braided shielding of cable and clamps this wrinkle into assembly with axial clamping motion to effect mechanical attachment and continuity of electrical shielding with cabinet. Cable jacket is also held in longitudinal clamp.

2 Claims, 3 Drawing Sheets

CABLE TERMINAL ASSEMBLY

BRIEF SUMMARY OF THE INVENTION

In order to interconnect electronic components it is frequently necessary to run cables between cabinets which enclose components therein. The cabinets are often of metal to provide electromagnetic shielding of the interior components, and the interconnecting cables frequently include shielding as a part of their structure. It is desirable to affix a connecting cable end securely to a cabinet which it connects, and it is also desirable to integrate the shielding of the cable to that of the cabinet wall to minimize leakage of radiation through the interface between cable and cabinet.

One form of cable which is frequently used has shielding made from braided or woven wires which surrounds the signal carrying conductors of the cable. This shielding is in turn covered with an elastomeric jacket to provide protection from abrasion and the like. The invention includes method and apparatus for attaching such cable to a cabinet wall through which the cable passes. The invention features forming an outward extending wrinkle in the woven shielding which goes around the periphery of the cable and clamping this wrinkle to structures electrically connected to the cabinet wall. The clamping is effected with motion axial with respect to the cable. The resulting structure, according to the invention, has advantages in providing a secure mechanical joint as well as superior continuity between the cable shielding and the cabinet wall. It is also inexpensive and convenient to assemble and install.

DETAILED DESCRIPTION

Figure 1:
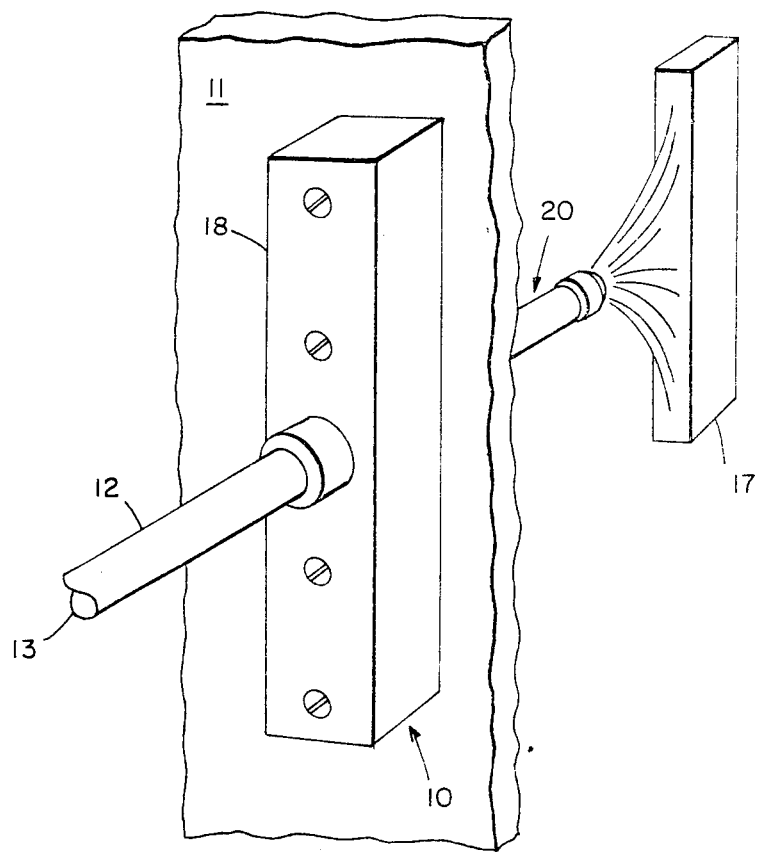
FIG. 1 shows a cable terminal assembly according to the invention installed on the enclosure wall of an electronic cabinet.
Figure 2:
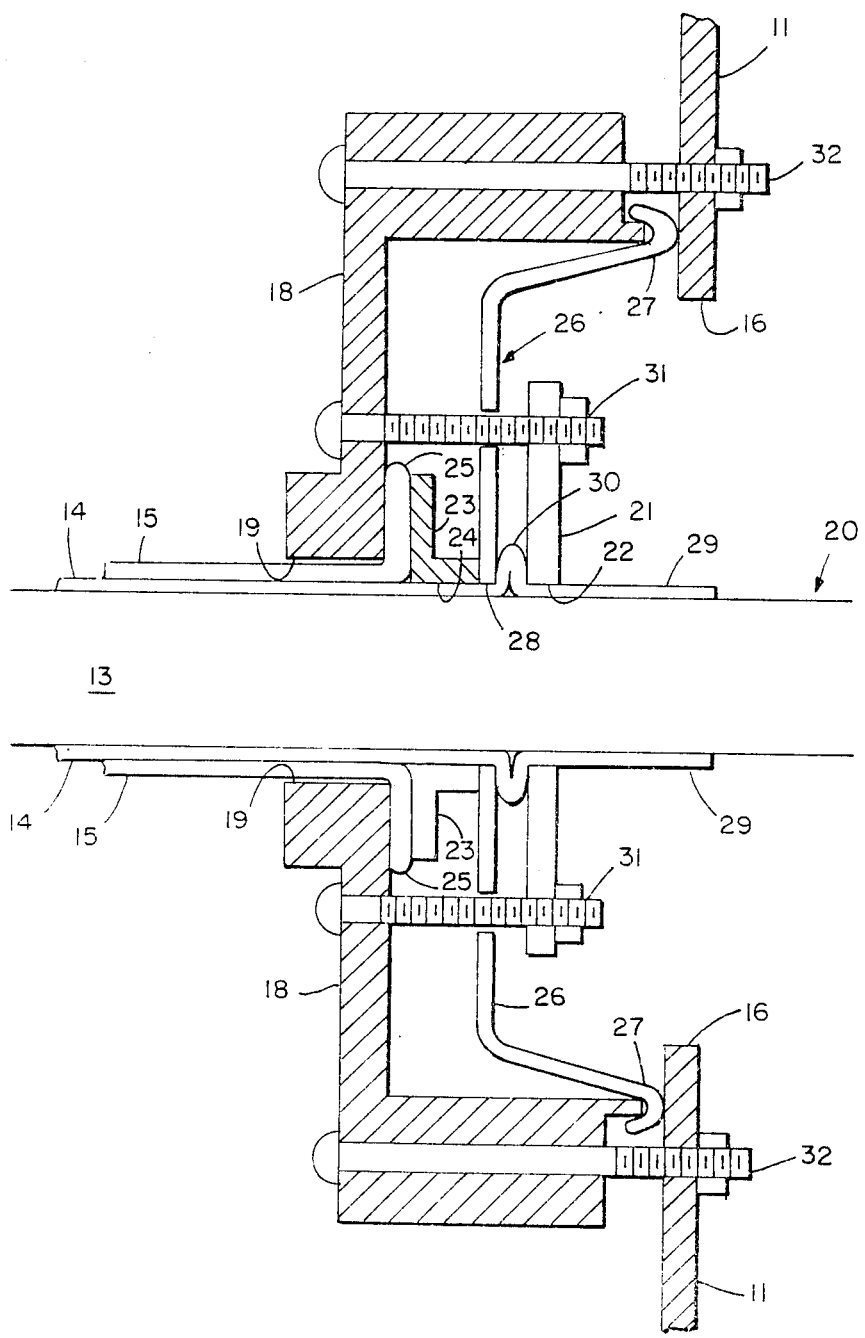
FIG. 2 shows a cross section through the assembly of FIG. 1.

With reference to FIGS. 1 and 2, cable terminal assembly 10, according to the invention, terminates round cable 12 having wires 13 covered with braided shielding 14 and insulating jacket 15. Assembly 10 is shown mounted on wall 11 of an electronic cabinet. Wall 11 has a hole 16 through which connector 17 passes. Typically connector 17 is suitable for connection to a printed circuit board, but may be designed for any desired connection interface inside wall 11.

Outer jaw 18 has an orifice 19 sized to fit closely around terminal portion 20 of cable 12 with its jacket intact. Inner jaw 21 has an orifice 22 sized to fit closely around terminal portion 20 of cable 12 with its insulating jacket stripped. Bridge 23 has an orifice 24 sized to fit closely around terminal portion 20 of cable 12 with its insulating jacket stripped. An end portion of jacket 15 is turned outward to form clamping tag 25. Extender wall 26 is made of flexible electrically conductive material such a sheet spring stock. It has an orifice 28 sized to fit closely around braided shielding 14, and a peripheral rim 27 sized and shaped to extend around hole 16 in cabinet wall 11.

Terminal assembly 10 may be conveniently assembled at a manufacturing facility as follows. Jacket 15 is stripped from a distal end 20 of cable 12 from a point about where the cable when installed is to pass through cabinet wall 11, and shielding 14 is stripped from a point somewhat further distally. Cable end 20 is passed through proximal jaw 18 to position proximal jaw 18 somewhat proximal to the end of jacket 15. The end of jacket 15 is slit and bent outward against proximal jaw 18 to form clamping tag 25. Distal end 20 is then passed through bridge 23 to position bridge 23 around unjacketed portion 29 of cable 12 and against clamping tag 25. Shield extending wall 26 is then placed around cable end 20 and against bridge 23. Shielding 14 is then puckered to form wrinkle 30 extending outward radially from the cable axis and against shield extending wall 26. Distal jaw 21 is then fitted over cable end 20 and tightened with clamping means, such as screws and nuts 31, against proximal jaw 18 to squeeze together in the longitudinal direction clamping tag 25, bridge 23, shielding extender wall 26, and wrinkle 30. Connector 17 is then connected to the end of cable 12.

Assembly 10 is advantageously installed at a field site by passing connector 17 through hole 16 of cabinet wall 11 and then securing the assembly 10 to cabinet wall 11 by screws and nuts 32, which at the same time cause jaw 18 to press rim 27 into contact with wall 11.

Figure 3:
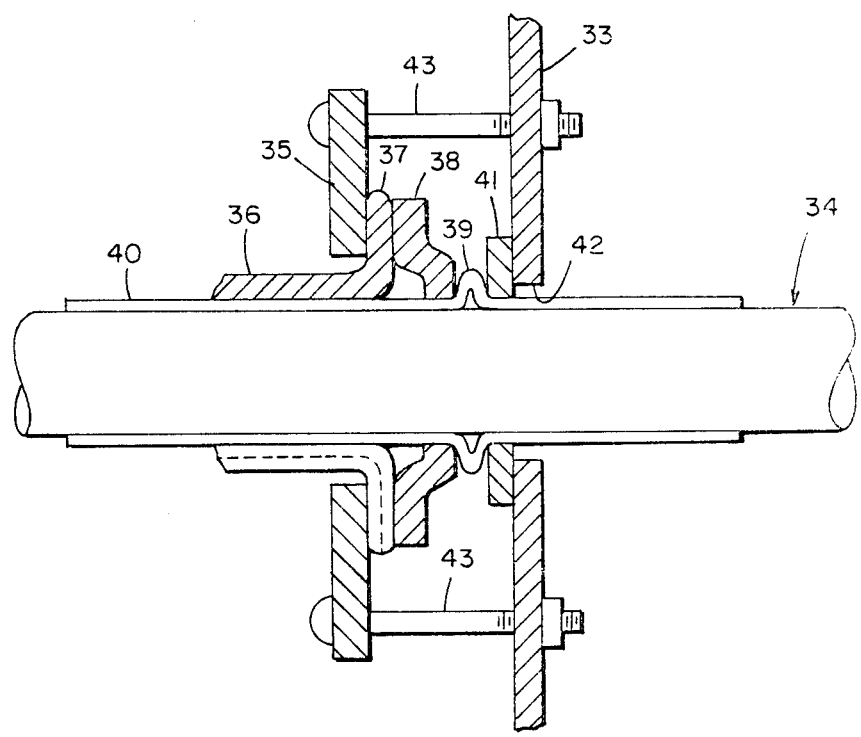
FIG. 3 shows another embodiment according to the invention.

Another embodiment of the invention shown in FIG. 3 is suitable for direct assembly to cabinet wall 33. Distal end 34 of a shielded, jacketed cable is passed through proximal jaw 35. Then jacket 36 is stripped from a point somewhat distal of jaw 35 and clamping tabs 37 are turned out against jaw 35. Bridge 38 is slipped over distal end 34 and against tabs 37. Wrinkle 39 is formed in shielding 40 against bridge 38 as previously described, and extending wall 41 is placed on distal end 34 against wrinkle 39. Distal end 34 of the cable is then passed through hole 42 in cabinet wall 33, and jaw 35 is drawn towards wall 33 with screws 43 or other clamping means to clamp the parts together in the longitudinal direction and affix them to wall 33. The wires of the cable may then be connected as required within cabinet wall 33. If hole 42 is sized and shaped to fit closely around cable end 34 with jacket stripped, extending wall 41 may be omitted from the assembly and the wrinkle seated directly against cabinet wall 33.

Those skilled in the art will readily recognize modifications of the described assembly which are within the invention.

What is claimed is:

1. A method for securing a distal end of a cable shielded with braided shielding and covered with a jacket to a wall through which the cable passes comprising the steps providing an orifice in said wall sized to closely fit around said cable when stripped of its jacket, providing a bridge with an orifice sized to closely fit around said cable when stripped of its jacket, providing a proximal jaw with an orifice sized to closely fit around said cable with its jacket, stripping said jacket from said cable distally from a point about where said cable is to pass through said wall to form an end on said jacket and an unjacketed portion of cable, positioning said proximal jaw around said cable a short distance proximal from the end of said jacket, bending the jacket end outward against said proximal jaw to form a clamping tag, positioning said bridge around said unjacketed portion of said cable and against said clamping tag, puckering at a position distal to said bridge a wrinkle in said braided shielding extending radially outward from said cable's axis, positioning said wrinkle so that said wrinkle contacts said wall, clamping said proximal jaw, said clamping tag, said bridge, said wrinkle, and said wall together with clamping means squeezing in the axial direction of the cable.

2. A cable terminal assembly for round cable having braided shielding and an insulating jacket, comprising a terminal portion of said cable, a proximal jaw with an orifice sized to closely fit around said cable with surrounding jacket intact, a distal jaw with an orifice sized to closely fit around said cable with jacket stripped, a bridge with an orifice sized to closely fit around said cable with jacket stripped, said cable portion passing through said proximal jaw and being stripped of said jacket from a point distal of said proximal jaw, and having a portion of the jacket distal of said proximal jaw orifice turned outwards against said proximal jaw and forming a clamping tag, said cable portion passing through said bridge, with said bridge pressing said clamping tag against said proximal jaw, said braided shielding of the cable being at a position distal of said bridge and proximal of said distal jaw bunched into a wrinkle extending radially outward from the cable axis to a radius greater than both said distal jaw orifice and said bridge orifice, said assembly including clamping means for drawing said proximal and distal jaws together along the cable's axis to clamp together said clamping tag, said bridge, and said wrinkle between said proximal and distal jaws, said assembly including an extender wall of conductive material making electrical contact with said wrinkle and extending outward to provide electrical contact circumscribing a hole in a cabinet wall through which said distal end of the cable passes.

* * * * *

UNITED STATES PATENT AND TRADEMARK OFFICE
CERTIFICATE OF CORRECTION

PATENT NO. : 4,778,947

DATED : Oct. 18, 1988

INVENTOR(S) : Gary A. Engelhardt

It is certified that error appears in the above-identified patent and that said Letters Patent is hereby corrected as shown below:

On the Title Page, Item [75],
"Englehardt" should read --Engelhardt--

Signed and Sealed this

Twenty-first Day of March, 1989

Attest:

DONALD J. QUIGG

Attesting Officer

Commissioner of Patents and Trademarks